(12) United States Patent
Lee et al.

(10) Patent No.: US 9,472,608 B2
(45) Date of Patent: Oct. 18, 2016

(54) CHIP INDUCTOR

(71) Applicant: SAMSUNG ELECTRO-MECHANICS CO., LTD., Suwon-si, Gyeonggi-do (KR)

(72) Inventors: Hwan Soo Lee, Suwon-si (KR); Hye Yeon Cha, Suwon-si (KR); Jung Min Park, Suwon-si (KR); Kang Heon Hur, Suwon-si (KR); Moon Soo Park, Suwon-si (KR)

(73) Assignee: SAMSUNG ELECTRO-MECHANICS CO., LTD, Suwon-Si, Gyeonggi-do (KR)

( * ) Notice: Subject to any disclaimer, the term of this patent is extended or adjusted under 35 U.S.C. 154(b) by 0 days.

(21) Appl. No.: 13/907,808

(22) Filed: May 31, 2013

(65) Prior Publication Data

US 2013/0341758 A1 Dec. 26, 2013

(30) Foreign Application Priority Data

May 31, 2012 (KR) .................. 10-2012-0058289

(51) Int. Cl.
*H01L 27/08* (2006.01)
*H01L 49/02* (2006.01)

(52) U.S. Cl.
CPC .................. *H01L 28/10* (2013.01)

(58) Field of Classification Search
CPC ............ H01L 23/645; H01L 23/5227; H01L 27/0288; H01L 28/10
USPC .................. 257/531, 277, E21.022
See application file for complete search history.

(56) References Cited

U.S. PATENT DOCUMENTS 7,920,043 B2 * 4/2011 Nakagawa et al. ........... 336/232
2005/0105225 A1 * 5/2005 Ahn et al. .................... 361/18
2009/0002117 A1 1/2009 Kawarai
2013/0222101 A1 * 8/2013 Ito et al. ........................ 336/83

FOREIGN PATENT DOCUMENTS

| JP | 08-330136 A | 12/1996 |
| JP | 2000-243909 A | 9/2000 |
| JP | 2006-310716 A | 11/2006 |
| JP | 2007-067214 A | 3/2007 |
| JP | 2007-305824 A | 11/2007 |
| JP | 2009-9985 A | 1/2009 |
| JP | 2010-205905 A | 9/2010 |
| JP | 2012-089765 A | 5/2012 |

OTHER PUBLICATIONS

Korean Office Action issued in Korean Application No. 10-2012-0058289 dated Aug. 20, 2014.
Notification of First Office Action dated Jun. 3, 2015 issued in Chinese Patent Application No. 201310209845.7 (English translation thereof).
Japanese Office Action issued in corresponding Japanese Application No. 2013-112236, dated Apr. 22, 2014.
Pre-Appeal Examination Report, dated Sep. 11, 2015 issued in Japanese Patent Application No. 2013-112236 (English translation thereof).

* cited by examiner

*Primary Examiner* — Tan N Tran
(74) *Attorney, Agent, or Firm* — McDermott Will & Emery LLP

(57) ABSTRACT

Disclosed herein is a chip inductor. The chip inductor according to the present invention includes a substrate on which a through-hole is formed, a conductive coil that is formed on the substrate, an upper resin composite magnetic layer that is filled to surround the conductive coil so that a core is formed on a center portion of the substrate, a lower resin composite magnetic layer that is formed on a bottom portion of the substrate, and an external electrode that is formed on both sides of the upper and lower resin composite magnetic layers.

11 Claims, 4 Drawing Sheets

| | Shape of through-hole of substrate | Inductance (uH) | DC bias (A) |
|---|---|---|---|
| Example 1 |  500 um | 0.85 | 3.5 |
| Example 2 |  800 um | 0.94 | 3.8 |
| Example 3 |  800 um | 1.05 | 4.0 |

CHIP INDUCTOR

CROSS REFERENCE(S) TO RELATED APPLICATIONS

This application claims the benefit under 35 U.S.C. Section 119 of Korean Patent Application Serial No. 10-2012-0058289, entitled "Chip Inductor" filed on May 31, 2012, which is hereby incorporated by reference in its entirety into this application.

BACKGROUND OF THE INVENTION

1. Technical Field

The present invention relates to a chip inductor, and more particularly, to a chip inductor in which a substrate on which a through-hole is provided is built.

2. Description of the Related Art

In general, an inductor is a basic circuit element having a magnetic inductance, and may include a coil and a core made of a magnetic material.

The inductor is one of the important passive elements constituting an electronic circuit, together with a resistor and a capacitor, and is used as a component that removes noise or constitutes an LC resonance circuit. The inductor may be structurally classified as a wire-wound inductor manufactured such that a coil is wound or printed on a ferrite magnetic body and electrodes are formed on both ends of the ferrite magnetic body, a laminated inductor manufactured such that an internal electrode pattern is printed and laminated on an insulating sheet made of a dielectric material or a magnetic material, and the like.

The inductor configured as above may be used in various systems such as low-noise amplifiers, mixers, voltage controlled oscillators, matching coils, and the like. In particular, a planar inductor is an inductor element that is implemented by a thin-film conductive coil formed on a substrate, and may be used in a DC-DC converter, a noise filter, and the like.

In recent years, in order to improve performance of the inductor element, a technique for forming a magnetic body on the substrate together with the thin-film conductive coil has been developed, and the performance of the inductor is greatly affected by the characteristics of the magnetic body such as a soft ferrite used inside the inductor, and the like.

In this instance, characteristics required for the magnetic body should have sufficient transmittivity in a high frequency domain at the time of high-frequency application, should not be thermally and mechanically deteriorated while the inductor is manufactured, and should be insulated from the conductive coil.

RELATED ART DOCUMENTS

[Patent Documents]
(Patent Document 1) Japanese Patent Laid-Open Publication No. 2000-243909

SUMMARY OF THE INVENTION

An object of the present invention is to provide a chip inductor in which a substrate is built to thereby enable the substrate to act as a gap, and bias characteristics are improved by increasing a magnetic flux density through a through-hole formed on the substrate.

According to an embodiment of the present invention, there is provided a chip inductor, including: a substrate on which a through-hole is formed; a conductive coil that is formed on the substrate; an upper resin composite magnetic layer that is filled to surround the conductive coil so that a core is formed on a center portion of the substrate; a lower resin composite magnetic layer that is formed on a bottom portion of the substrate; and an external electrode that is formed on both sides of the upper and lower resin composite magnetic layers.

Here, the substrate may be made of a nonmagnetic material of resin or a ceramic material.

In addition, the through-hole formed on the substrate may be formed in the center portion of the substrate or four edges of the substrate.

In this instance, the substrate may have a thickness of 50 µm or less.

The upper and lower resin composite magnetic layers may be made of a mixture of a metal magnetic material and a polymer material, or ferrite only.

Here, when the upper and lower resin composite magnetic layers are made of a mixture of a metal magnetic material and a polymer material, a metal powder may be mixed within the polymer to be evenly distributed.

In this instance, the polymer material may be epoxy, polyimide, LCP, and the like.

Meanwhile, an insulating layer may further be formed outside the conductive coil. The insulating layer may be made of a polymer or other resin materials each having insulation characteristics. This aims to enable the insulating layer to be insulated from metal powders included in the upper resin composite magnetic layer in which the conductive coil is filled so as to be embedded.

The chip inductor configured as above may be extended in two directions symmetrical to a quadrant of the substrate to thereby be electrically connected with the external electrode in which the conductive coil surrounds side surfaces of the upper and lower resin composite magnetic layers.

DESCRIPTION OF THE PREFERRED EMBODIMENTS

The acting effects and technical configuration with respect to the objects of a chip inductor according to the present invention will be clearly understood by the following description in which exemplary embodiments of the present invention are described with reference to the accompanying drawings.

Figure 1A:
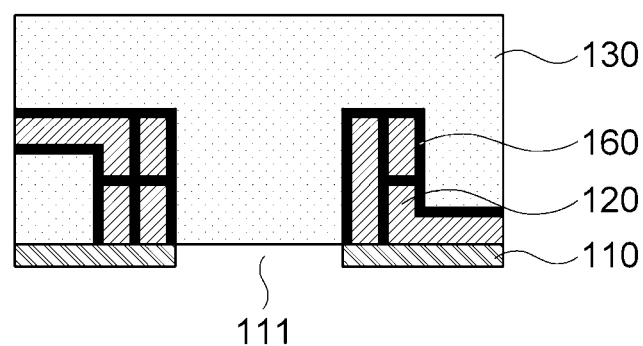
FIGS. 1A, 1B and 1C are cross-sectional views showing a process of manufacturing a chip inductor according to an embodiment of the present invention.
Figure 1B:
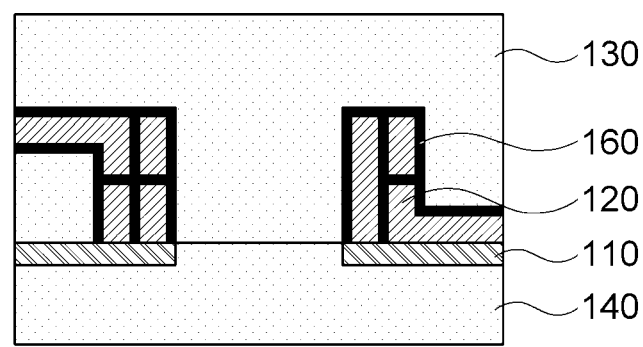
Figure 1C:
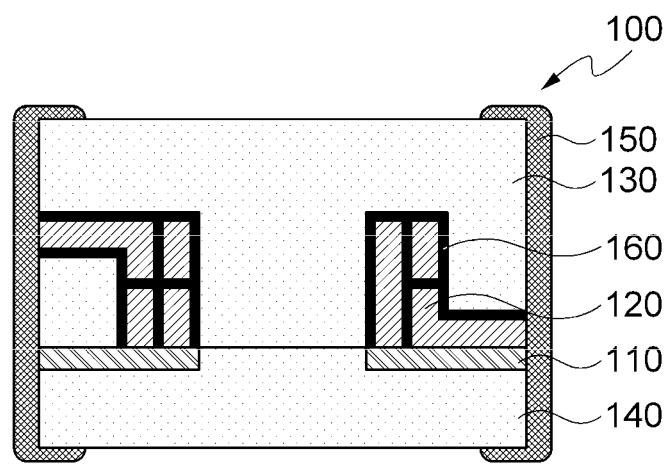
Figure 2:
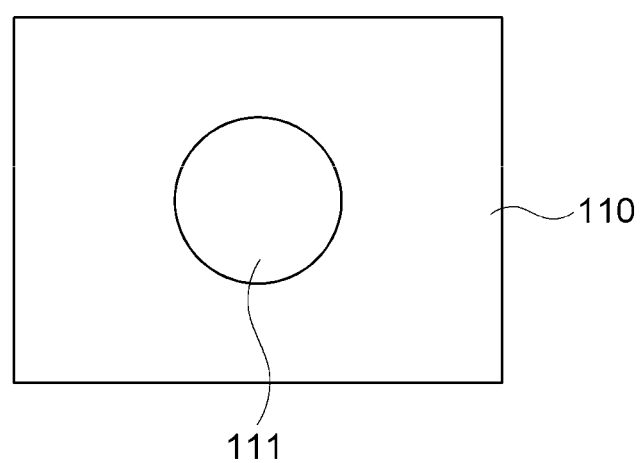
FIG. 2 is a plan view showing a substrate that is built in a chip inductor according to an embodiment of the present invention.

FIG. 1 is a cross-sectional view showing a process of manufacturing a chip inductor according to an embodiment of the present invention, and FIG. 2 is a plan view showing a substrate that is built in a chip inductor according to an embodiment of the present invention.

As shown in the drawings, the chip inductor 100 according to the present embodiment may include a substrate 110, a conductive coil 120 wound on the substrate 110, an upper resin composite magnetic layer 130 formed on the substrate 110 in such a manner that the conductive coil 120 is embedded, and a lower resin composite magnetic layer 140 formed on a bottom portion of the substrate 110.

In addition, an external electrode 150 may be further formed on side surfaces of the upper and lower resin composite magnetic layers 130 and 140 including the substrate 110.

The substrate 110 may be made of a nonmagnetic material using a nonconductive material such as a resin material, a ceramic, or the like. Here, when the substrate 110 is made of the resin material, an FR4 substrate or a polyimide substrate may be used, or other polymer substrates may be used. In this instance, a thickness of the substrate 110 may be preferably 50 μm or less. Here, when the thickness of the substrate 110 exceeds 50 μm, it is difficult to configure the thin-film chip inductor, so that the chip inductor having the thickness which does not exceed 50 μm may be preferably designed.

In addition, the substrate 110 may include a through-hole 111 formed on a center portion thereof. The through-hole 111 may be shaped into a circuit, a square, etc., and the through-hole 111 is not limited to a specific shape thereof other than the circle and square shapes, as long as the through-hole 111 can penetrate through top and bottom portions of the substrate.

The substrate 110 configured as above may support the conductive coil 120 and the upper resin composite magnetic layer 130 which are formed on a top surface of the substrate 110 in a manufacturing process of the substrate 110, and act as a gap layer within the chip inductor after manufacturing the chip inductor.

The conductive coil 120 may be formed on a side surface of the upper surface of the substrate 110 except the through-hole 111 formed on the center portion of the substrate 110. The conductive coil 120 may be formed in a scheme such as electrical plating, screen printing, or the like, and may be configured in the form of a spiral coil made of copper.

By configuring the conductive coil 120 in the form of the spiral coil, low electrical resistivity and sufficient inductance may be ensured.

In addition, the conductive coil 120 may be configured in the form of the spiral coil, and may be laminated in a single or a plurality of layers.

Meanwhile, the upper resin composite magnetic layer 130 may be covered on the substrate 110, so that the conductive coil 120 is embedded. The upper resin composite magnetic layer 130 may be preferably filled with a sufficient height in which the conductive coil 120 can be embedded, and may be made of only ferrite that is a magnetic material.

When forming the magnetic layer using the ferrite, ferrite plating may be used, and a thickness of the magnetic layer may be accurately controlled through a ferrite plating device in a spin spray scheme, thereby ensuring uniformity of the thickness. In addition, the spin spray scheme is performed at a relatively low temperature of 100° C. or less, and therefore a thermal effect with respect to the substrate 110 or the conductive coil 120 may be minimized.

In addition, the magnetic layer may be made of any one of the metal materials such as Mo-permalloy, permalloy, Fe—Si—Al alloy, Fe—Si alloy, and amorphous other than the ferrite.

The upper resin composite magnetic layer 130 may be configured in such a manner that one metal powder selected from Fe, Ni, Zn, Co, Ba, Sr, and Mn is distributed in the polymer. In this instance, the polymer may be a resin material such as epoxy, polyimide, LCP, etc.

In addition, the lower resin composite magnetic layer 140 by which a bottom surface of the substrate 110 is covered may be formed on the bottom portion of the substrate 110. The lower resin composite magnetic layer 140 may be made of the same material as that of the upper resin composite magnetic layer 130 formed on the substrate 110.

An insulating layer 160 surrounding an outer peripheral surface of the conductive coil 120 may be further formed inside the upper resin composite magnetic layer 130 formed on the substrate 110, and prevent the conductive coil 120 made of Au or Cu from contacting with the upper resin composite magnetic layer 130 to be conducted.

That is, the insulating layer 160 may be formed when the upper resin composite magnetic layer 130 is made of a material in which a metal material is distributed and mixed in the polymer. The insulating layer 160 may be made of a polymer having insulation characteristics and a resin material other than the polymer, and may be used to enable the conductive coil 120 to be insulated from the upper resin composite magnetic layer 130 in which the metal powder is mixed.

Accordingly, when the upper resin composite magnetic layer 130 formed on the substrate 110 is made of only an insulating material in which the metal power is not mixed, the insulating layer 160 may not be separately provided.

An external electrode 150 may be formed on both sides of the chip inductor 100. The external electrode 150 is used to enable electrical connection of the chip inductor 100, and may be formed by an electrode formation process such as dipping or dispensing of solder, and the like after forming the upper and lower resin composite magnetic layers 130 and 140 on the substrate 110.

In this instance, the external electrode 150 may be electrically connected with the conductive coil 120. The conductive coil 120 may be provided in the form of a coil on both sides of a core of the upper resin composite magnetic layer 130 so as to be electrically connected with the external electrode 150, and may be extended to be symmetrical of both sides of a quadrant of the substrate with respect to the top surface of the substrate 110. The conductive coil 120 extended to the outside of the quadrant of the substrate 110 may be electrically connected with the external electrode 150.

The upper and lower resin composite magnetic layers 130 and 140 have high resistivity characteristics and high transmittivity. The upper resin composite magnetic layer 130 is formed in very close proximity to the conductive coil 120, thereby improving quality characteristics of the chip inductor, and manufacturing the chip inductor having a thin thickness while implementing high inductance.

In the chip inductor 100 according to the present embodiment configured as above, a direction of a magnetic path in the core formed in the center portion of the upper resin composite magnetic layer 130 formed on the substrate 110 is exerted from the top of the substrate 110 to the bottom or from the bottom to the top through the through-hole 111 of the substrate 110, and thereby a magnetic flux density is increased within the chip inductor to thereby improve inductance, and characteristics of a DC bias is improved.

Figure 3:
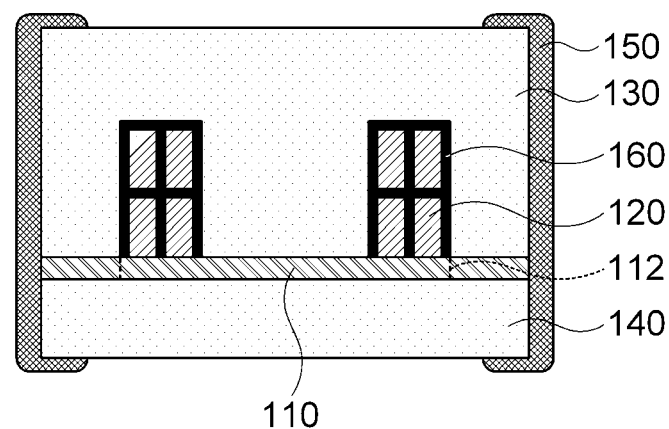
FIG. 3 is a cross-sectional view showing a chip inductor according to another embodiment of the present invention.
Figure 4:
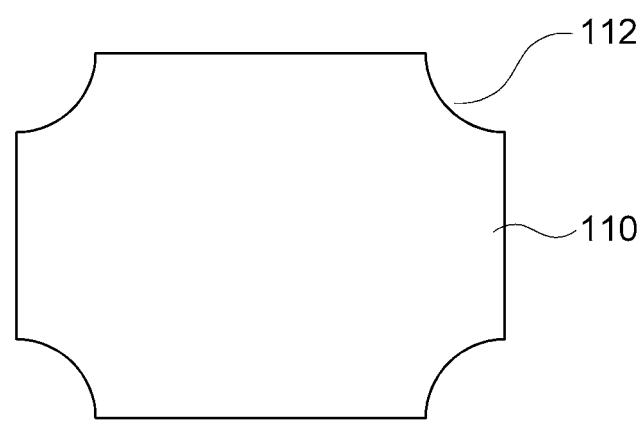
FIG. 4 is a plan view showing a substrate applied to a chip inductor according to another embodiment of the present invention.

Next, FIG. 3 is a cross-sectional view showing a chip inductor according to another embodiment of the present invention, and FIG. 4 is a plan view showing a substrate applied to a chip inductor according to another embodiment of the present invention.

As shown in the drawings, as described above, the chip inductor 100 according to the present embodiment may include the substrate 110, the conductive coil 120, and the upper and lower resin composite magnetic layers 130 and 140, and the external electrode 150 may be formed on both sides of the upper and lower resin composite magnetic layers 130 and 140.

In this instance, the same reference numerals refer to the same components as those in the above described embodiment, and a detailed description thereof will be omitted.

According to the present embodiment, the substrate 110 that is built-in between the upper and lower resin composite magnetic layers 130 and 140 should be made of a nonmagnetic material using a nonconductive material such as a resin material or a ceramic material, and at least one through-hole 112 may be formed on four edges of the substrate 110.

As shown in FIG. 4, the through-hole 112 may be formed to be curved toward the center portion of the substrate 110, but may be formed in other shapes, that is, formed to be perpendicular to the center portion. The shape of the through-hole may be changed in accordance with a disposition of the conductive coil 120 formed on the substrate 110.

In addition, the chip inductor 100 according to the present embodiment may be configured such that the through-hole is respectively formed on the center portion of the substrate 110 and the four edges thereof.

In addition, a thickness of the substrate 110 may be preferably 50 µm or less so as to design the thin-shaped chip inductor. Here, the substrate 110 may support the conductive coil 120 and the upper resin composite magnetic layer 130 which are formed on a top surface of the substrate 110, and act as a gap layer within the chip inductor after manufacturing the chip inductor.

Meanwhile, the conductive coil 120 may be formed on the center portion of the top surface of the substrate 110 except the through-holes 112 formed on the four edges of the substrate 110, formed in a scheme such as electrical plating, screen printing, or the like, and preferably configured in the form of a spiral coil made of copper.

The upper resin composite magnetic layer 130 may be formed on the substrate 110 on which the conductive coil 120 is formed, and the lower resin composite magnetic layer 140 may be formed on a bottom portion of the substrate 110. In addition, the external electrode 150 that is used for electrical connection of the chip inductor 100 may be further formed on both side surfaces of the upper and lower resin composite magnetic layer 130 and 140 including the substrate 110.

In the chip inductor 100 according to the present embodiment configured as above, a direction of a magnetic path of the upper and lower resin composite magnetic layers 130 and 140 is exerted from the top of the substrate 110 to the bottom or from the bottom to the top through the through-holes 112 formed at the four edges of the substrate 110, and thereby a magnetic flux density is increased within the chip inductor to thereby improve inductance, and characteristics of a DC bias is improved.

Meanwhile, results obtained when simulating characteristics of the chip inductor using the substrate 110 applied to the present embodiment are as follows.

Figure 5:
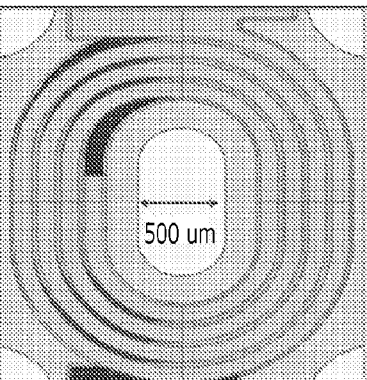
FIG. 5 is a plan view showing the results of the simulation to a chip inductor according to another embodiment of the present invention.
Figure 5:
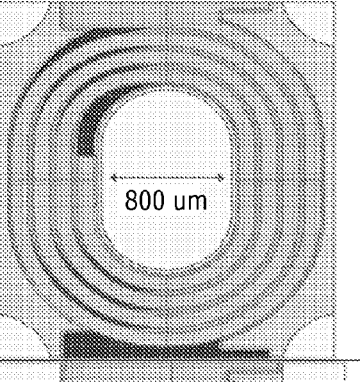
Figure 5:
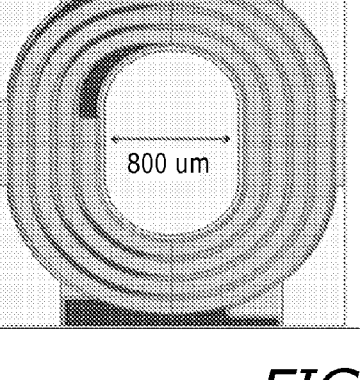

As known from the results of the simulation shown in FIG. 5, the chip inductor according to the present embodiment has improved inductance (Ls) and characteristics of a DC bias for each Example compared to the conventional chip inductor in which the substrate is formed in a flat plate.

That is, compared to the conventional substrate, formed in the flat plate, having an inductance (Ls) of about 0.6 uH and a DC bias of 3.0 A, the chip inductor to which the substrate with the through-hole formed thereon is applied has an inductance of 0.85 to 1.05 uH in accordance with the shape of the substrate in Examples 1 to 3, so that it can be seen that a capacity of the chip inductor is increased compared to the conventional chip inductor to which the flat plate-shaped substrate is applied.

As set forth above, according to the embodiments of the present invention, in the chip inductor, the substrate is built in the chip inductor so as to support the conductive coil and act as a gap within the chip inductor, thereby manufacturing the chip inductor which is compact and thinner.

In addition, by forming the through-hole on a predetermined position of the substrate built in the chip inductor, a magnetic flux density of each of the upper and lower resin composite magnetic layers is increased through the through-hole, thereby implementing high inductance and improving characteristics of the DC bias.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Accordingly, such modifications, additions and substitutions should also be understood to fall within the scope of the present invention.

What is claimed is:

1. A chip inductor, comprising:
a substrate on which a through-hole is formed;
a conductive coil that is formed on an upper surface of the substrate and laminated in a plurality of layers;
an upper resin composite magnetic layer that is filled to surround the conductive coil so that a core is formed in a center portion of the Upper resin composite magnetic layer formed on the upper side of the substrate;
a lower resin composite magnetic layer that is formed on a bottom portion of the substrate; and
an external electrode that is formed on both sides of the upper and lower resin composite magnetic layers,
wherein an insulating layer is formed surrounding an outer peripheral surface of the conductive coil, and
wherein the conductive coil is extended in two symmetrical directions of both sides of quadrants of the substrate to thereby be electrically connected with the external electrode.

2. The chip inductor according to claim 1, wherein the substrate is made of a nonmagnetic material of resin or a ceramic material.

3. The chip inductor according to claim 2, wherein the through-hole formed on the substrate is formed in the center portion of the substrate.

4. The chip inductor according to claim 1, wherein the upper and lower resin composite magnetic layers are made of a mixture of a metal magnetic material and a polymer material.

5. The chip inductor according to claim 1, wherein the upper and lower resin composite magnetic layers is made of ferrite or any one of metal materials of Mo-permalloy, permalloy, Fe—Si—Al alloy, Fe—Si alloy, and amorphous.

6. The chip inductor according to claim 1, wherein one or more of the through-hole(s) is further formed on four edges of the substrate.

7. A chip inductor, comprising:
- a substrate on which at least one through-hole is formed at four edges of the substrate;
- a conductive coil that is formed on an upper surface of the substrate in the form of a spiral coil and laminated in a plurality of layers;
- an insulating layer that is formed outside the conductive coil;
- an upper resin composite magnetic layer that is filled to surround the conductive coil so that a core is formed in a center portion of the upper resin composite magnetic layer formed on the upper side of the substrate;
- a lower resin composite magnetic layer that is formed on a bottom portion of the substrate; and
- an external electrode that is formed on both sides of the upper and lower resin composite magnetic layers,
- wherein the conductive coil is extended in two symmetrical directions of both sides of quadrants of the substrate to thereby be electrically connected with the external electrode.

8. The chip inductor according to claim 7, wherein the upper and lower resin composite magnetic layers are separated from each other with respect to the substrate to thereby be made of a mixture of a metal magnetic material and a polymer material, and are made of the same material.

9. The chip inductor according to claim 7, wherein the substrate is made of a nonmagnetic material of resin or a ceramic material.

10. The chip inductor according to claim 7, wherein the upper and lower resin composite magnetic layers are made of ferrite or any one of metal materials of Mo-permalloy, permalloy, Fe—Si—Al alloy, Fe—Si alloy, and amorphous.

11. The chip inductor according to claim 7, wherein one other through-hole is further formed on the center portion of the substrate.

* * * * *